United States Patent
Balembois et al.

(10) Patent No.: US 12,158,601 B2
(45) Date of Patent: Dec. 3, 2024

(54) 3D CONCENTRATOR

(71) Applicants: CENTRE NATIONAL DE LA RECHERCHE SCIENTIFIQUE, Paris (FR); INSTITUT OPTIQUE THEORIQUE APPLIQUEE, Palaiseau (FR); UNIVERSITE PARIS-SACLAY, Gif-sur-Yvette (FR)

(72) Inventors: François Balembois, Palaiseau (FR); Pierre Pichon, Palaiseau (FR)

(73) Assignees: CENTRE NATIONAL DE LA RECHERCHE SCIENTIFIQUE, Paris (FR); INSTITUT OPTIQUE THEORIQUE APPLIQUEE, Palaiseau (FR); UNIVERSITE PARIS-SACLAY, Gif-sur-Yvette (FR)

( * ) Notice: Subject to any disclaimer, the term of this patent is extended or adjusted under 35 U.S.C. 154(b) by 205 days.

(21) Appl. No.: 18/012,968

(22) PCT Filed: Jun. 30, 2021

(86) PCT No.: PCT/EP2021/067947
§ 371 (c)(1),
(2) Date: Dec. 26, 2022

(87) PCT Pub. No.: WO2022/008310
PCT Pub. Date: Jan. 13, 2022

(65) Prior Publication Data
US 2023/0236349 A1 Jul. 27, 2023

(30) Foreign Application Priority Data
Jul. 7, 2020 (EP) .................................. 20305768

(51) Int. Cl.
*F21V 8/00* (2006.01)
*G02B 6/42* (2006.01)
*H01L 33/50* (2010.01)

(52) U.S. Cl.
CPC ......... *G02B 6/0003* (2013.01); *G02B 6/0028* (2013.01); *G02B 6/0031* (2013.01);
(Continued)

(58) Field of Classification Search
CPC ...... G02B 6/0003; G02B 6/0055; G02B 5/00; G02B 6/42; G03B 21/208; F21V 8/00; H01L 33/50
See application file for complete search history.

(56) References Cited

U.S. PATENT DOCUMENTS 8,384,107 B1 2/2013 Shum
9,151,884 B2 * 10/2015 Rutherford .......... G02B 6/0003
(Continued)

FOREIGN PATENT DOCUMENTS

EP 2 947 484 A1 11/2015
FR 3 045 965 A1 6/2017
(Continued)

OTHER PUBLICATIONS

Dick, et al., "High-brightness source based on luminescent concentration", Optics Express, vol. 24, Issue 14, pp. A1069-A1074, 2016.
(Continued)

*Primary Examiner* — William J Carter
(74) *Attorney, Agent, or Firm* — Maier & Maier, PLLC

(57) ABSTRACT

A light-emission device includes at least one emission module comprising: a luminescent crystal known as a concentrator crystal with at least six faces which are parallel in pairs, including a first and a second face, known as lateral faces, perpendicular to a direction x and separated by a distance corresponding to a horizontal dimension of the concentrator in the direction x; a first mirror, which is configured such as to cover the first lateral face at least partly, defining a surface area covered by the first mirror, and at least one surface area (SFS1) which is not covered by the first mirror defining an associated output face; a second
(Continued)

mirror, which is configured such as to cover at least 95% of the second lateral face; a brightness triggering element, which is designed to generate emission of brightness radiation ($L_F$) in the luminescent crystal; a ratio R between the non-covered surface area (SFS1) and a surface area ($S_L$) of the first lateral face being determined such that rays of the brightness radiation are reflected on the first and second mirrors, and are propagated over a mean distance $L_{moy}$ such that $$L_p = \frac{1}{\alpha} > L_{moy} \gg L$$

within the luminescent crystal before passing through at least one output face, forming an output beam, where $\alpha$ is a coefficient of loss per unit of length of the concentrator for the brightness radiation.

16 Claims, 14 Drawing Sheets

(52) U.S. Cl.
CPC .......... *G02B 6/0068* (2013.01); *G02B 6/4298* (2013.01); *H01L 33/505* (2013.01); *H01L 33/507* (2013.01)

(56) References Cited

U.S. PATENT DOCUMENTS

| 10,823,893 | B2* | 11/2020 | Hoelen | G02B 6/03694 |
| 11,280,948 | B2* | 3/2022 | Hikmet | F21K 9/60 |
| 2006/0227570 | A1* | 10/2006 | Rutherford | H04N 9/315 |
| | | | | 348/E9.027 |
| 2007/0279915 | A1* | 12/2007 | Rutherford | G03B 21/204 |
| | | | | 362/341 |
| 2013/0294064 | A1 | 11/2013 | McCaughan et al. | |

FOREIGN PATENT DOCUMENTS

| WO | 2008/042703 A1 | 4/2008 |
| WO | 2016/0063047 A1 | 4/2016 |
| WO | 2020/089246 A1 | 5/2020 |

OTHER PUBLICATIONS

Barbet, et al., "Light-emitting diode pumped luminescent concentrators: a new opportunity for low-cost solid-state lasers", Optica, vol. 3, No. 5, pp. 465-468, 2016.

Meinardi, et al. "Large-area luminescent solar concentrators based on 'Stokes-shift-engineered' nanocrystals in a mass-polymerized PMMA matrix", Nature Photonics, vol. 8, No. 5, pp. 392-399, 2014.

Boer, et al., "High-brightness source based on luminescent concentration", Optics Express, vol. 24, No. 14, p. A1069, Jul. 2016.

* cited by examiner

3D CONCENTRATOR

CROSS-REFERENCE TO RELATED APPLICATIONS

This application is a National Stage of International patent application PCT/EP2021/067947, filed on Jun. 30, 2021, which claims priority to foreign European patent application No. EP 20305768.2, filed on Jul. 7, 2020, the disclosures of which are incorporated by reference in their entirety.

FIELD OF THE INVENTION

The present invention concerns the field of luminescent concentrators which are pumped by light-emitting diodes (LEDs), and more particularly luminescent concentrators which are pumped by LEDs used as a source of light.

BACKGROUND

Light-emitting diodes (LEDs) have many applications in the field of lighting. However, the brightness of the LEDs is limited to values which are not suitable for certain applications.

A solution for increasing the brightness of the LEDs is to use light concentrators which are pumped by LEDs (see for example Barbet, Adrien, et al. "Light-emitting diode pumped luminescent concentrators: a new opportunity for low-cost solid-state lasers." *Optica* 3.5 (2016): 465-468.). This concentrator is for example a crystal which is fluorescent in the visible spectrum (red-orange), such as Ce:YAG, which absorbs in the blue spectrum (around 450 nm), at a wavelength where the LEDs are very high-performance. The crystal is cut in the form of a plane, which is lined with hundreds (or even thousands) of LEDs on the two large surfaces, and with emission in sections. These concentrators make it possible to obtain brightness values 10 to 20 times higher than that of an LED.

FIGS. 1A and 1B illustrate an example of a light-emission module ME0 known in the prior art, based on a concentrator crystal CL. FIGS. 1A and 1B represent schematically views respectively in perspective and from the side of the same emission module ME0. The emission module ME0 comprises a set of LEDs which are designed to emit in a first spectral band, and a light concentrator CL. The concentrator CL is a fluorescent parallelepiped crystal with at least one lighting face SI1, SI2, with dimensions L×w, lit by the light-emitting radiation $L_d$ emitted by the LEDs. The lighting faces SI1, SI2 are also known as "large faces". The thickness of the concentrator is known as e.

The crystal of the concentrator is configured to absorb said light-emitting radiation $L_d$. The flow of light emitted by the LEDs and directed towards the lighting face is absorbed by the luminophores Lum of the fluorescent crystal, which are distributed in all of the volume of the crystal, and thus emit fluorescence radiation in the interior of the crystal. The rays which are emitted can be classified in two main categories, i.e.:

the trapped rays which are known as $L_p$: these rays are trapped in the crystal as a result of the total internal reflection (RTI) on the different faces of the crystal. These rays exist if the crystal is a parallelepiped provided with 6 faces which are parallel in pairs and perpendicular to one another. The trapped rays never exit from the crystal, with the exception of the imperfections thereof.

the non-trapped rays are the rays which end by exiting from the crystal. They are separated into two sub-categories, i.e. the guided rays known as $L_g$, the characteristic of which is to be guided by total internal reflection, and exit onto one of the faces of the concentrator, and the non-guided rays known as $L_{out}$, which exit directly from the concentrator without being reflected on the faces.

FIG. 1C is a representation of the angular diagram of the rays which are emitted and trapped in the concentrator. The dark caps represent angles corresponding to the non-trapped (guided and non-guided) rays, and the light areas represent the angles corresponding to the trapped rays. In this representation, provided by way of example, the medium selected as the concentrator crystal CL is a Ce:YAG crystal (index $n_2$=1.82), with a critical angle of 33° when the ambient medium is air. The percentage of radiation trapped by total internal reflection compared with the non-trapped radiation is determined by the index of the crystal and that of the ambient medium by means of Snell-Descartes' law.

In a concentrator according to the prior art, such as the one illustrated in FIGS. 1A to 1C, the lighting of the output face is proportional to the ratio L/e between the length and the thickness of the concentrator crystal. In general, the concentrators have very large ratios of L/e (for example L=100 mm, e=1 mm, L/e=100). The number of reflections on the two large faces $SI_1$, $SI_2$ is therefore large, i.e. approximately a hundred for a ray inclined by 20-30° propagating in L=100 mm. On the other hand, it is far less large on the lateral faces. FIGS. 1D and 1E compare the difference in the number of reflections for a ray with a total internal reflection limit in a concentrator crystal with an index n=1.82 (limit angle $\theta_{crit}$=33°) on the two planes: parallel (xy) and perpendicular (xz) to the large faces. On the plane of the large faces (xy), the number of reflections is associated with the width w of the concentrator. FIG. 1D represents a concentrator with a width w>>e. In this case, the concentration effect takes place on a single plane (xz) perpendicular to the large faces: this type of concentration is defined in this case as "1D" concentration. The "1D" concentration is used for large-sized luminescent concentrators in the domain of solar concentrators (see for example Meinardi, Francesco, et al. "Large-area luminescent solar concentrators based on 'Stokes-shift-engineered' nanocrystals in a mass-polymerized PMMA matrix." *Nature Photonics* 8.5 (2014): 392).

FIG. 1E represents a concentrator, the width w of which is of the same order of magnitude as the thickness e. In this case, the concentration effect takes place on the two planes (xz) and (xy): the reflections on the 4 lateral faces of the concentrator are used. This type of concentration is defined in this case as "2D" concentration. This configuration is mostly used for concentrators which are pumped by LEDs (see for example D. K. G. de Boer, D. Bruls, and H. Jagt "High-brightness source based on luminescent concentration" Optics Express, vol. 24, no. 14, page A1069, July 2016.). One of the disadvantages of this 2D concentration is that the lighting faces have a reduced surface area, which limits the pumping power of the concentrator, and therefore its output power.

The "1D" and "2D" concentrations give the same output brightness for a given material where L and e are fixed. In fact, the brightness does not depend on w, but only on the ratio L/e.

Although the increase in lighting by means of a concentrator is very significant compared with LEDs, the lighting remains low in comparison with the lighting provided by laser diodes for example. In addition, the form of the output beam depends on the geometry of the concentrator (in general, the output surface is elliptical). Finally, in the fluorescent concentrators according to the prior art, the thickness e must be greater than the absorption length associated with the pump radiation, so that the power absorbed is maximal in a low-absorption environment with a "1D" or "2D" concentration.

SUMMARY OF THE INVENTION

The objective of the invention is to increase the output brightness of a concentrator, while providing flexibility relating to the parameters of the output beam and the specifications concerning the concentrator material (dimensions, losses, absorption).

For this purpose, a subject of the invention is a light-emission device comprising:
at least one emission module comprising:
a luminescent crystal known as a concentrator crystal with at least six faces which are parallel in pairs, including a first and a second face, known as lateral faces, perpendicular to a direction x and separated by a distance L corresponding to a horizontal dimension of said concentrator in the direction x;
a first mirror, which is configured such as to cover said first lateral face at least partly, defining a surface area covered by said first mirror, and at least one surface area which is not covered by said first mirror defining an associated output face;
a second mirror, which is configured such as to cover at least 95% of said second lateral face;
a brightness triggering element, which is designed to generate emission of brightness radiation in said luminescent crystal;
a ratio R between the non-covered surface area and a surface area of the first lateral face being determined such that rays of the brightness radiation are reflected on said first and second mirrors, and are propagated over a mean distance $L_{moy}$ such that $$L_p = \frac{1}{\alpha} > L_{moy} \gg L$$

within the luminescent crystal before passing through at least one output face, forming an output beam, where $\alpha$ is a coefficient of loss per unit of length of said concentrator for said brightness radiation.

According to particular embodiments of the invention:
the ratio R is 1/4 or less, preferably 1/8 or less;
a coefficient of loss per unit of length of said concentrator for said brightness radiation a and said ratio R are designed such that $L_{moy} < L_p = 1/\alpha$;
the brightness triggering element comprises a plurality of light-emitting diodes or lasers or flash lamps which are configured to emit light-emitting radiation at a wavelength $\lambda_d$, said diodes being designed such as to illuminate at least one face known as the lighting face of the concentrator, said concentrator being a fluorescent crystal designed to absorb said light-emitting radiation, then emit fluorescence radiation corresponding to said brightness radiation;
a vertical dimension e of the concentrator in a direction z perpendicular to said lighting face is greater than, or equal to, a length of absorption $L_{abs}$ of said light-emitting radiation by said concentrator;
the brightness triggering element comprises a heating element which is configured to heat said concentrator crystal such that it emits said brightness radiation by thermoluminescence;
the brightness triggering element comprises a lens, which is designed to focus solar radiation on a so-called lighting face of the concentrator, said concentrator being designed to absorb said solar radiation, then emit fluorescence radiation corresponding to said brightness radiation;
the concentrator crystal has a beveled edge situated between the first lateral face and another face of said concentrator crystal, a surface area of the beveled edge being considered as forming part of the surface area of the first lateral face for calculation of said ratio R, at least one portion of a surface area of the beveled edge not being covered and defining an associated output face;
the concentrator crystal has a beveled corner situated between the first lateral face and two other faces of said concentrator crystal, a surface area of the beveled corner being considered as forming part of the surface area of the first lateral face for calculation of said ratio R, at least one portion of said surface area of the beveled corner not being covered, and defining an associated output face;
the first mirror is designed to define n≥1 non-covered surface areas, defining n output faces through which n output beams pass, said device also comprising:
n optical fibers; and
n optical coupling systems, each designed to couple an output beam in a different optical fiber;
the first mirror is designed such that a geometric extent of each output beam is substantially equal to a geometric extent of said optical fiber coupling said output beam;
the device comprises two additional mirrors covering two parallel faces known as sections of the concentrator, said two additional mirrors being designed such as to cover all of the sections;
the device comprises a first and a second emission module and a first brightness triggering element which is associated with the first emission module, a face of the concentrator crystal of the second emission module, different from a lateral face, being attached to an output face of the concentrator crystal of said first emission module, such that the first output beam of the first emission module, known as the primary brightness radiation, constitutes the brightness triggering element of the second emission module, with the second emission module generating a second output beam, known as the secondary brightness radiation, having a central wavelength which is offset relative to a central wavelength of the primary brightness radiation;
dimensions of the second module on a vertical plane yz parallel to said output face of the concentrator crystal of the first module are smaller than, or equal to, dimensions of said output face of the concentrator of the first emission module;
a dimension of the concentrator of the second module in the direction x is greater than a length of absorption $L_{abs,2}$ of the primary brightness radiation by the concentrator of the second module;
the first mirror is fitted on a translation system which is designed to displace said first mirror relative to said first lateral face, such as to reduce or increase the non-covered surface;

the first mirror is designed such that the form of a non-covered surface area is square, rectangular, circular, elliptical, triangular, or also polygonal.

BRIEF DESCRIPTION OF THE DRAWINGS

Other characteristics, details and advantages of the invention will become apparent from reading the description provided with reference to the appended drawings, provided by way of example, and which represent, respectively.

In the figures, unless otherwise indicated, the elements are not to scale.

DETAILED DESCRIPTION

Figure 2:
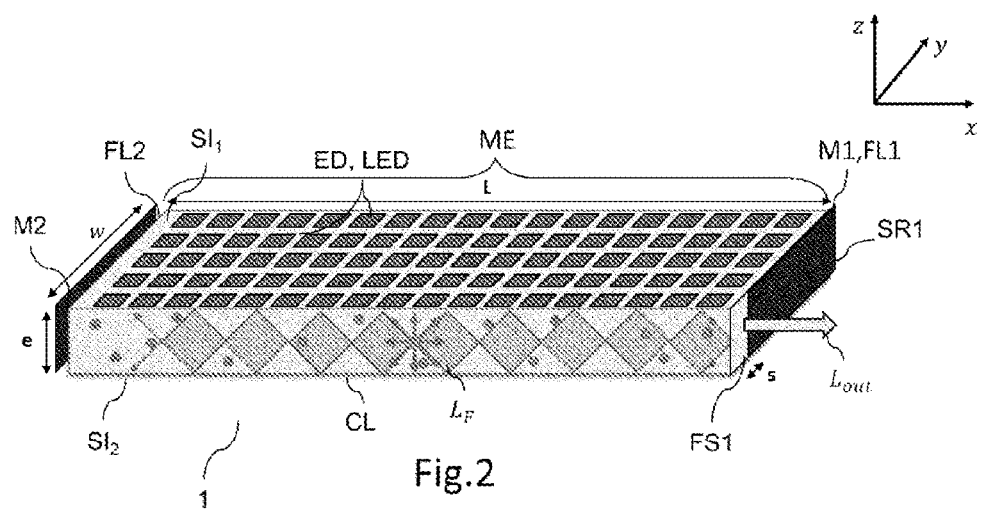
FIG. 2, a schematic view of a light-emission device according to the invention.

FIG. 2 shows a schematic view of a light-emission device 1 according to the invention. The device comprises an emission module ME comprising a so-called concentrator luminescent crystal CL. This concentrator crystal comprises six faces which are parallel in pairs, including a first and second face, known as lateral faces FL1, FL2, with dimensions w×e. These lateral faces are perpendicular to a direction x and are separated by a distance L (known as length) corresponding to a horizontal dimension of the concentrator in the direction x, L being the largest of the dimensions of the concentrator. The faces $SI_1$ and $SI_2$ with dimensions L×w are known as the "large faces" or "lighting faces", and the faces with dimensions L×e are known as "sections".

The device 1 comprises a brightness triggering element ED which is designed to generate emission of brightness radiation $L_F$ in the luminescent crystal. As will be specified hereinafter, the brightness triggering element can be a plurality of LEDs, one or a plurality of optical elements designed to direct the solar radiation onto the concentrator, or also an element which is designed to heat the concentrator.

In a manner different from the concentrators 1D and 2D previously referred to, the objective of the invention is to obtain a concentration effect in a supplementary direction, in order to increase the brightness obtained at the output from the concentrator. This concentration effect is known as 3D, since the radiation is concentrated within the crystal on all of the faces thereof. For this purpose, the device 1 comprises two mirrors M1 and M2 which are designed to create a supplementary concentration effect on the plane (xy) on the lateral faces, in addition to the concentration effect obtained on the plane (xz) on the large faces (and optionally on the plane (xy) on the sections, according to the width w of the concentrator). Thus, it is possible to increase the reflections on the lateral faces before the rays of the brightness radiation "exit" from the concentrator, which gives rise to an increase in the lighting on the output face, and of the brightness, by the effect of bending the rays back onto themselves.

The first mirror M1 is configured such as to cover at least partly the first lateral face FL1 defining a surface area SR1 which is covered by the first mirror, and at least one surface area SFS1 which is not covered by the first mirror, defining an associated output face FS1. For this purpose, the first mirror M1 is positioned facing, attached to, or deposited on, the first lateral face FL1. After numerous simulations, and as will be explained hereinafter, the inventors realized that the ratio of the surface area of the output face to that of the first lateral face was the critical parameter making it possible to ensure a concentrator effect on the lateral faces, and thus ensure an increase in the lighting on the output face. The dimensions of the emission module are designed such that a ratio $R=SFS1/S_L$ between the non-covered surface area SFS1 (surface area of the output face FS1) and the total surface area of the first lateral face $S_L$ is designed such that rays of the brightness radiation are reflected on the first and the second mirrors, and are propagated on average over a mean distance $L_{moy} \gg L$ within the crystal CL, before passing through an output face FS1. The rays of the brightness radiation which exit from the concentrator form an output beam $L_{out}$. $L_{moy} \gg L$ means in this case that $L_{moy}$ is 7 times, and preferably 15 times greater than L.

As will be described in detail hereinafter, a ratio $R=SFS1/S_L$, which is designed to obtain the condition $L_{moy} \gg L$, makes it possible to ensure that the concentrator effect exists on the 3D plane, i.e. instead of passing directly through the output face FS1 after having been generated, the brightness radiation is mostly reflected within the crystal, and on average travels outward and back several times within the crystal before exiting via an output face FS1. The smaller the ratio $R=SFS1/S_L$ is, the more the mean distance $L_{moy}$ traveled by the brightness rays within the concentrator before exiting increases. The lighting on the output face is thus increased, since the brightness radiation has the time to "fill" the concentrator before exiting. This point is particularly counterintuitive, since it could be thought that the ratio of the output powers with and without the mirror M1 is simply equal to the ratio of the surface areas $SFS1/S_L$: this would be the case if all the rays were emitted from a single plane. In this case, the effect of volume and multiple reflections in the interior of the volume makes it possible to obtain greater output power on the output face FS1. Notably, the inventors found that, when the ratio R is 1/4 or less, or preferably 1/8 or less, the mean distance $L_{moy}$ is sufficient for the module ME to provide a consequent concentrator effect (see hereinafter). Thus, according to a preferred embodiment of the invention, the ratio R is 1/4 or less, or preferably 1/8 or less.

The second mirror M2 is configured such as to cover at least 99% of the second lateral face FL2, opposite the first lateral face. Preferably, the second mirror M2 covers all of the second lateral face.

Thus, the brightness radiation can exit from the lateral faces only via the output face FS1. In fact, the mirrors M1, M2 force the rays which should exit via the lateral faces to travel more times in the concentrator, until they pass through the non-covered surface area, and thus the output face FS1. This travel means that there are multiple reflections within the concentrator on the lateral faces. Thus, the lighting of the output beam at the output face is increased by the use of the mirrors M1 and M2.

In the illustration in FIG. 2, by way of non-limiting example, the output face is rectangular, and has a dimension equal to the thickness e of the concentrator in the direction z, and a dimension s in the direction y. Thus, the output face has the dimension s×e. In this example, the ratio R is thus equal to the ratio s/w. Alternatively, according to another embodiment, the first mirror is designed such that the form of the non-covered surface area (and thus of the output face) is square, rectangular, circular, elliptical, triangular, or also polygonal.

The mirrors M1 and M2 have a reflection factor greater than 95%, and preferably greater than 98%, for the brightness radiation.

Figure 3A:
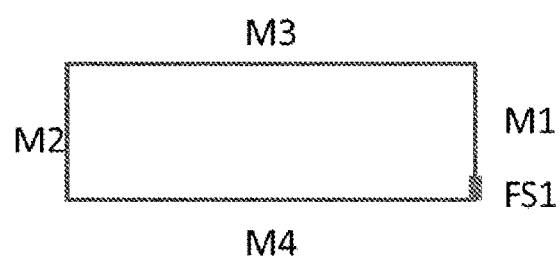
FIG. 3A and FIG. 3B, a schematic representation of travel of a ray of the fluorescence radiation.
Figure 3B:
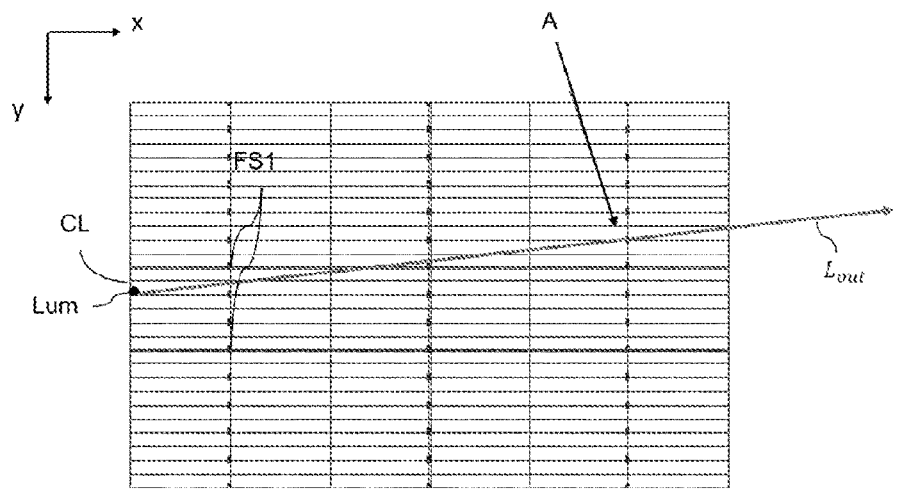

FIG. 3B is a schematic representation of travel of a ray of the fluorescence radiation emitted by a luminophore Lum on the plane (xy) of the lighting face $SI_1$ and of the moment when it "exits" from the concentrator via the output face FS1. In this embodiment, the device also comprises two additional mirrors M3, M4 (shown in FIG. 3A), which are arranged facing, or deposited on, the sections of the concentrator. The two additional mirrors are arranged such as to cover all of the sections. These mirrors make it possible to reflect within the concentrator the portion of the brightness radiation which is not guided by total internal reflection, and which should exit from the concentrator via the sections, and thus increase the lighting on the output face. According to this embodiment, and those of the following figures, the mirror M2 covers the second lateral face FL2 completely, in order to maximize the lighting on the output face. Alternatively, according to another embodiment, the mirror M2 does not cover the second lateral face FL2 completely.

In the representation in FIG. 3B, the concentrator CL is indicated at each reflection for clarity of the drawing, instead of showing the multiple reflections of the ray. Thus, each individual rectangle (or riposte) represents a concentrator CL. Since the planes are all parallel in pairs, the equivalent ray corresponding to the ray reflected by the first and second mirrors is propagated in a straight line on the drawing, including the concentrator and its ripostes relative to the 4 mirrors which constitute the lateral faces. The output face FS1 is also represented in each riposte. In order to determine whether the ray will actually exit, it is necessary to observe the point A where it intercepts one of the ripostes of the output face. In the example in FIG. 3B, the ray will ultimately exit after 4 reflections on the sections and 4 reflections on the lateral faces.

Each riposte of the output area thus corresponds to a series of angles which permit exiting.

By adding up all of these angles and taking into account losses by propagation of the brightness radiation in the concentrator CL, it is possible to estimate the mean transmission starting from a source point in the concentrator, for a given angular range.

Figure 4:
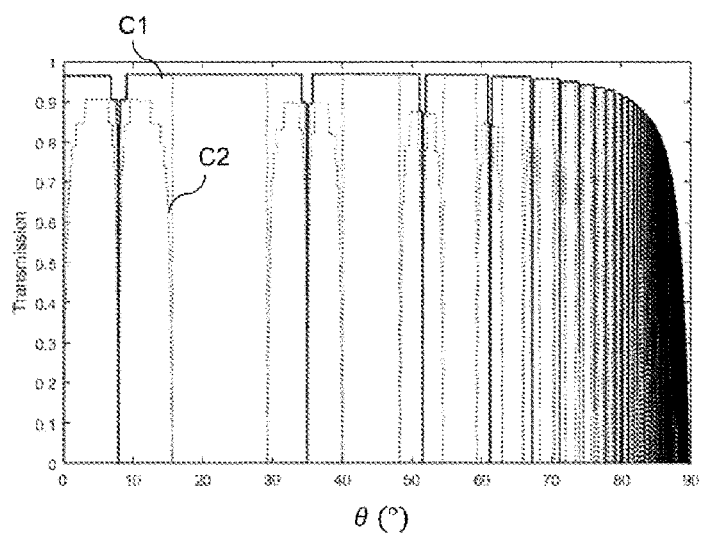
FIG. 4, two transmission curves according to the output angle of the rays of the fluorescence radiation.

FIG. 4 has two transmission curves C1, C2 according to the output angle of the rays of the fluorescence radiation. The output angle θ is indicated relative to the normal of the output face, on the plane xy. In the example in FIG. 4, the dimensions of the concentrator are as follows: L=100 mm, w=14 mm and e=1 mm. These dimensions are given by way of example, and are non-limiting. According to this embodiment and those of FIGS. 5A to 10, the first mirror is designed such that the output face is rectangular, and has a dimension equal to the thickness e of the concentrator in the direction z, and a dimension s in the direction y. Thus, the output face has a surface area $SNR_1$=s×e. In this specific case, the ratio R is thus equal to s/w. Alternatively, the output face is not rectangular. The curves C1 and C2 correspond to a device wherein respectively s=7 mm; R=1/2 and s=5 mm; R≈1/3.

In this case, all the possible rays are taken into consideration, with incidences of rays passing through the output face of up to 90°. This case would exist if the concentrator were to adhere to an output medium with the same index, and if the lateral faces were perfectly reflective for all the incidences. In the case where air is the ambient medium surrounding the concentrator, only rays smaller than the critical angle $\theta_{crit}=\sin^{-1}(1/n)$ must be taken into consideration, where n is the index of the concentrator. In the case of a Ce:YAG concentrator, n=1.82, which corresponds to a maximum output angle of 33°.

The curves C1 and C2 comprise very small transmission points which correspond to rays with angles which almost never pass through the output face. It should be noted that the transmission is highly "peaked" around these points. "Peaked" means in this case that the gradient of the curve around these points is very steep. When the dimension of the output face decreases (curve C2), there is a larger number of angles (and therefore of rays) corresponding to these low transmission points. In addition, it should be noted that the transmission decreases globally for strong incidences: this is associated with the increase in the mean propagation distance $L_{moy}$ of the brightness radiation in the structure, with very numerous reflections on the lateral faces, and thus the increase in the losses by propagation in the medium. This effect will be described in greater detail in FIGS. 5A to 7B.

Figure 5A:
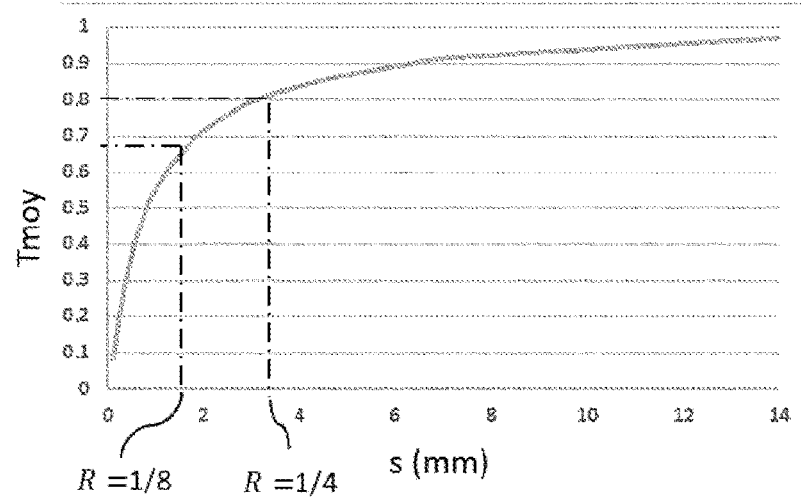
FIG. 5A, the transmission averaged according to the dimension s of the output face.

FIG. 5A represents the averaged transmission for all of the brightness rays passing through the output face FS1 (see FIG. 4) in the air, according to the dimension s of the output face. The dimensions are identical to those of the example of FIG. 4. In this precise case, the ratio $R=SFS1/S_L$ is thus equal to w/s. The curves of FIGS. 5A and 5B thus have an X-axis proportional to R (this applies for FIGS. 7A to 8B and 10). As previously explained, the output angles of the brightness rays are between 0 and 33°. The mean transmission Tmoy remains very high even for small values of s, thanks to the multiple reflections in the concentrator. Thus, the transmission is still 50% for s=1 mm (i.e. R=1/14) and for a coefficient of losses $\alpha=3.10^{-4}$ mm$^{-1}$ (conventional value for a Ce:YAG concentrator). For a given output face surface area, the length $L_{moy}$ is associated with the mean transmission $T_{moy}$ and with the coefficient of loss in mm$^{-1}$, a, by the following equation: $L_{moy}=e^{-\alpha T_{moy}}$. $L_{moy}$ depends only on the losses $\alpha$ and on $T_{moy}$ which depends on the ratio R. The length corresponding to the losses is defined as $L_p=1/\alpha$.

Figure 5B:
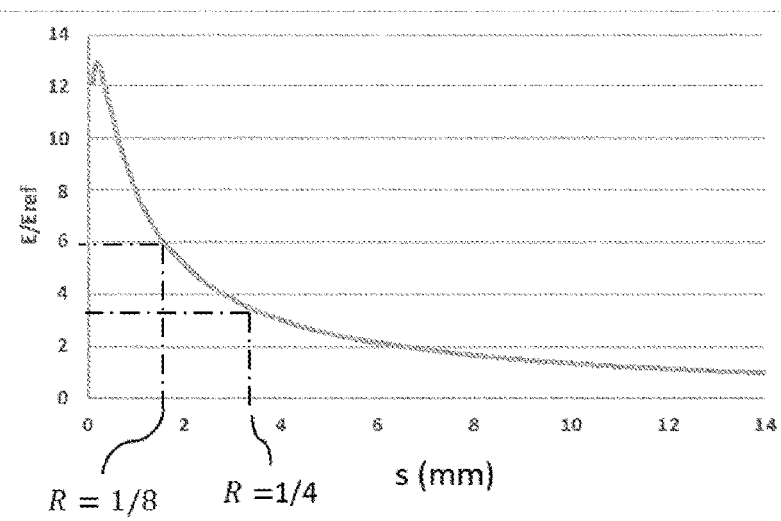
FIG. 5B, the development of the ratio $E/E_{ref}$ according to the dimension s of the output face.

FIG. 5B represents the development of the ratio $E/E_{ref}$ between the lighting E on the output face obtained with a device according to the invention, and the lighting $E_{ref}$ on the first lateral face FL1 obtained in a conventional configuration without a mirror M1 but with a mirror M2, according to the dimension s of the output face. The parameters are identical to those of FIG. 5A. FIG. 5B makes it possible to observe that the lighting in the output area increases strongly when it has a sufficiently small surface area. For a value of R=1/4 (s=3.5 mm), it is noted that the lighting on the output face increases by a factor of more than 3. For a value of R=1/8 (s=1.75 mm), it is noted that the lighting on the output face increases by a factor of 6. These values correspond to a concentrator effect which fulfils the 3D concentration making it possible to obtain an order of magnitude (factor 10) in the increase of the lighting. Notably, when the output face goes from a dimension of s=14 mm; R=1 to s=1 mm; R=1/14, the lighting increases by a factor of 8. The effect of 3D concentration applies in the juxtaposition of the effects illustrated by FIGS. 5A and 5B by finding a compromise, i.e. transmission which remains at a high level despite a significant reduction in the surface area of the output face, and consequently lighting which increases. For values s of the output face which are very low, it is noted that the lighting on the output face decreases. This effect is caused by substantial losses by propagation of the brightness radiation in the concentrator which predominate over the 3D concentration effect, thus giving a lower limit to the ratio R for an optimal 3D effect.

By taking stock of the rays which are reflected on M1 then on M2 at each passage, and taking into account the rays which exit at each impact on the face FL1, it is possible to show that the mean length traveled in the medium is $$L_{moy} = \left(\frac{2}{R} - 1\right) \times L. \quad \text{(eq 1)}$$

Figure 5C:
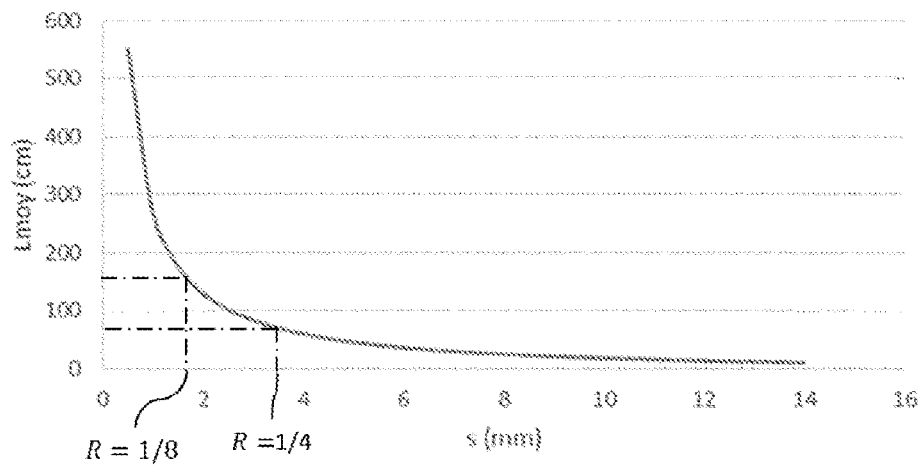
FIG. 5C, the development of the mean length according to the dimension s of the output face.

FIG. 5 illustrates the development of the mean length $L_{moy}$ according to the dimension s of the output face. The parameters are identical to those of the example of FIG. 4. The curve of FIG. 5C is obtained from the equation eq1, and makes it possible to represent the direct impact of the selection of the dimension s (and thus of the ratio R) on the mean length traveled by a brightness ray before it exits from the concentrator. It is noted that, for a ratio of R=1/4, $L_{moy}$ is approximately 80 cm, i.e. 7 times more than L, and makes it possible to obtain an increase in the lighting by a factor greater than 3 (see FIG. 5B). For a ratio of R=1/8, $L_{moy}$ is approximately 160 cm, i.e. 15 times more than L, thus making it possible to obtain an increase of the lighting by a factor of 6.

Figure 6A:
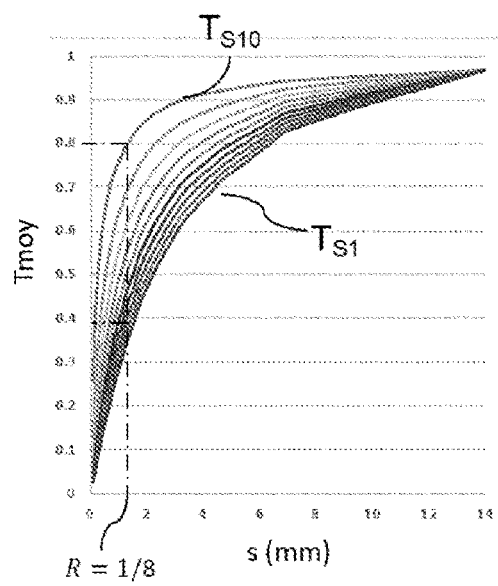
FIG. 6A and FIG. 6B, respectively the mean transmission $T_{moy}$ and the development of the ratio $E/E_{ref}$ according to the dimension s of the output face for different coefficient of loss values.
Figure 6B:
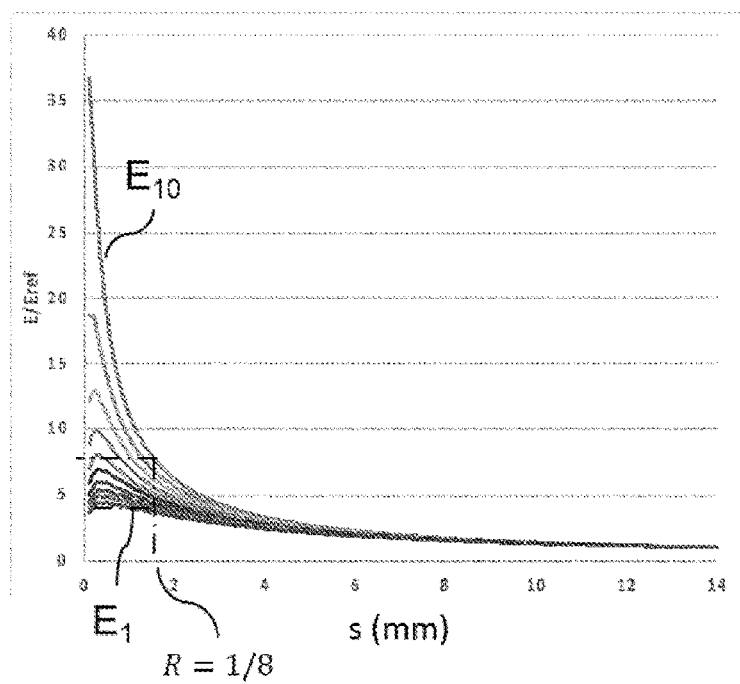

FIGS. 6A and 6B represent respectively the mean transmission $T_{moy}$ and the development of the ratio $E/E_{ref}$ according to the dimension s of the output face for different values of coefficient of loss (from $\alpha=10^{-4}$ mm$^{-1}$ for the curves $TS_{10}$ and $E_{10}$ to $\alpha=10^{-3}$ mm$^{-1}$ for the curves $TS_1$ and $E_1$). The other parameters are identical to those of FIG. 5A and FIG. 5B. It is observed that the increase in the losses has the effect of reducing the mean transmission and the lighting on the output face (ratio $E/E_{ref}$). This effect is due to the increase in the losses by propagation (and the reduction of $L_p$) and is stronger for small output face surface areas (R small) since $L_{moy}$ is greater. For a value of R=1/8 (s=1.75 mm), it is noted that the lighting on the output face increases by a factor ranging from 4 to 8, when the losses go from $\alpha=10^{-4}$ mm$^{-1}$ to $\alpha=10^{-3}$ mm$^{-1}$. As shown in FIG. 6B, for losses of up to $10^{-3}$ mm$^{-1}$ (curve $E_1$), the concentration effect on the lighting still exists but it seems to be "peaked". Thus, it is important for the dimensions of the first mirror to be adapted to the losses of the concentrator, in order to guarantee a 3D concentration effect (see FIGS. 7A and 7B).

Figure 7A:
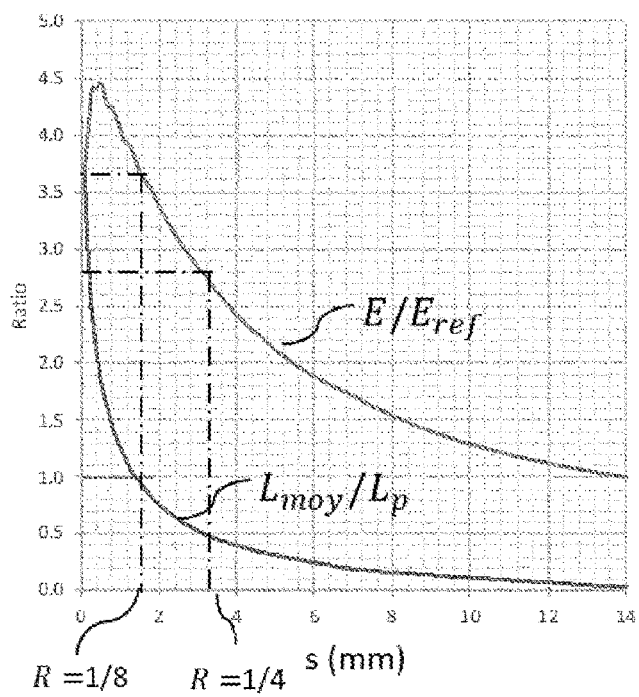
FIG. 7A and FIG. 7B, development of the ratio $E/E_{ref}$ and the ratio $L_{moy}/L_p$ according to the dimension s of the output face for two different coefficient of loss values.
Figure 7B:
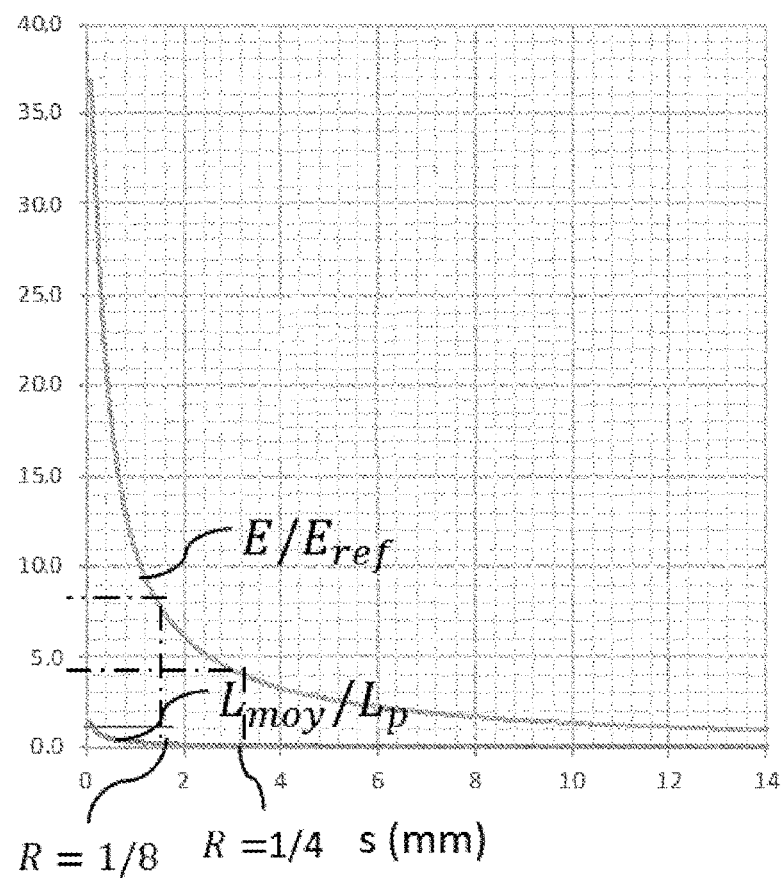

FIGS. 7A and 7B represent a development of the ratio $E/E_{ref}$ and of the ratio $L_{moy}/L_p$ according to the dimension s of the output face for a concentrator with a coefficient of loss of respectively $\alpha=10^{-3}$ mm$^{-1}$ and $\alpha=10^{-4}$ mm$^{-1}$ or respectively Lp=1 m and Lp=10 m. $L_{moy}$ increases when the surface area of the output face decreases. In fact, each ray must then travel along a longer path before passing through the output face. It is noted that, for high levels of losses (FIG. 7A), $L_{moy}$ can rapidly exceed $L_p$ for a very small output face surface area (s smaller than 1.6 mm). When s is very small, the lighting of the output face (ratio $E/E_{ref}$) decreases when s decreases, because of substantial losses by propagation in the medium. On the other hand, for a larger output face surface area (for s>0.3 mm in FIG. 7A), the lighting of the output face (ratio $E/E_{ref}$) increases when s decreases. For a value of R=1/4, the lighting increases by a factor of 2.75 compared with R=1 (s=14 mm) and $L_{moy}=0.5\times L_p=0.5$ m. $L_{moy}$ is in this case 5 times greater than L. For a value R=1/8, the lighting increases by a factor of 3.75 compared with R=1 and $L_{moy}=L_p=1$ m. $L_{moy}$ is thus 10 times higher than L.

For smaller losses (FIG. 7B), even when s is very small, the lighting of the output face (ratio $E/E_{ref}$) continues to increase when s decreases, since $L_{moy}$ remains lower than $L_p$. In this case, the losses do not predominate over the concentrator effect, even for an output face with a small surface area. For a value of R=1/4, the lighting increases by a factor of 4 compared with R=1. For a value of R=1/8, the lighting increases by a factor of 8 compared with R=1. In both cases, $L_{moy}$ is very much greater than L, and remains smaller than $L_p=10$ m.

Also, preferably, the ratio R is adapted relative to the losses. It can be shown that the optimum ratio is R=2$\alpha$L. Thus, according to a preferred embodiment of the invention, the ratio R is R=2$\alpha$L, in order to have the greatest possible ratio of $E/E_{ref}$.

Contrary to the 1D or 2D concentration, the 3D concentration does not depend on the geometric factor L/e. In fact, in the device according to the invention, the lighting on the output face is proportional to $$\frac{S_L}{SFS1} e^{-L_{moy}/L_p},$$

where SFS1 is the surface area of the output face FS1 and $S_L$ is the surface area of the lateral face SL1. This characteristic confers far more modularity on the 3D concentrator according to the invention compared with the 1D and 2D concentrator according to the prior art.

Figure 1A:
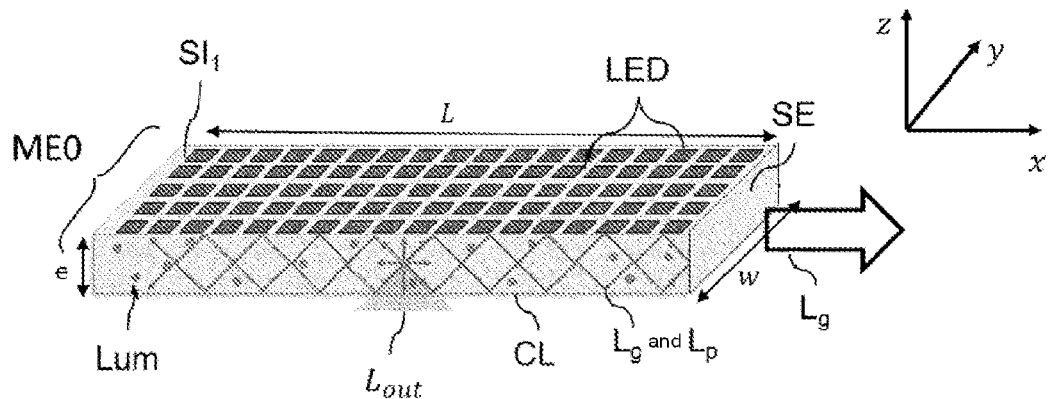
FIG. 1A, FIG. 1B and FIG. 1C, a schematic view of an example of a light-emission module known in the prior art.
Figure 1B:
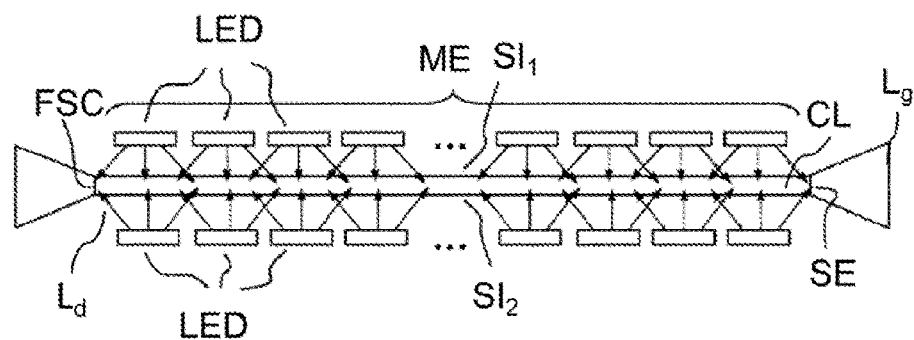
Figure 1C:
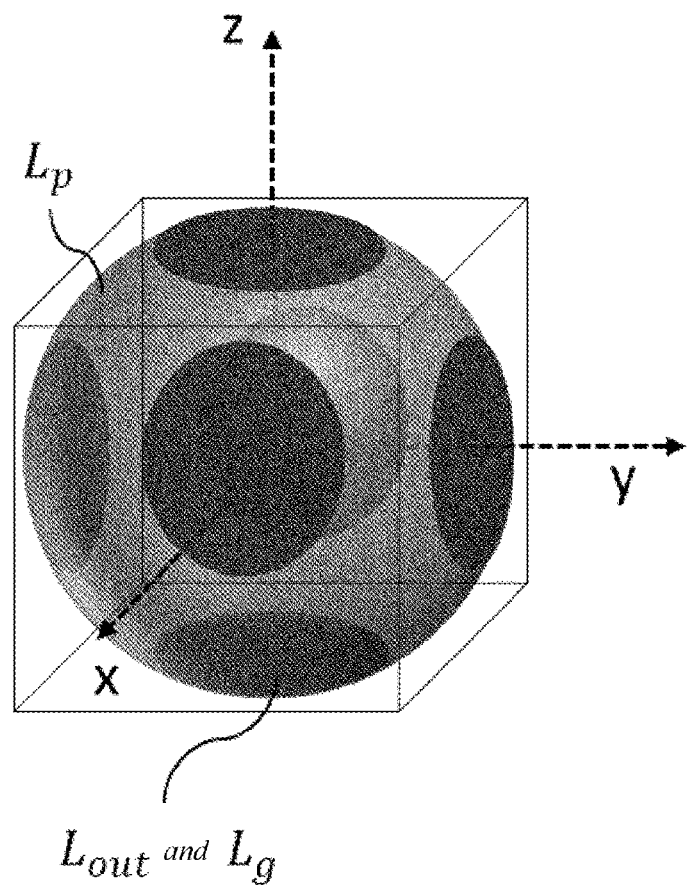
Figure 1D:
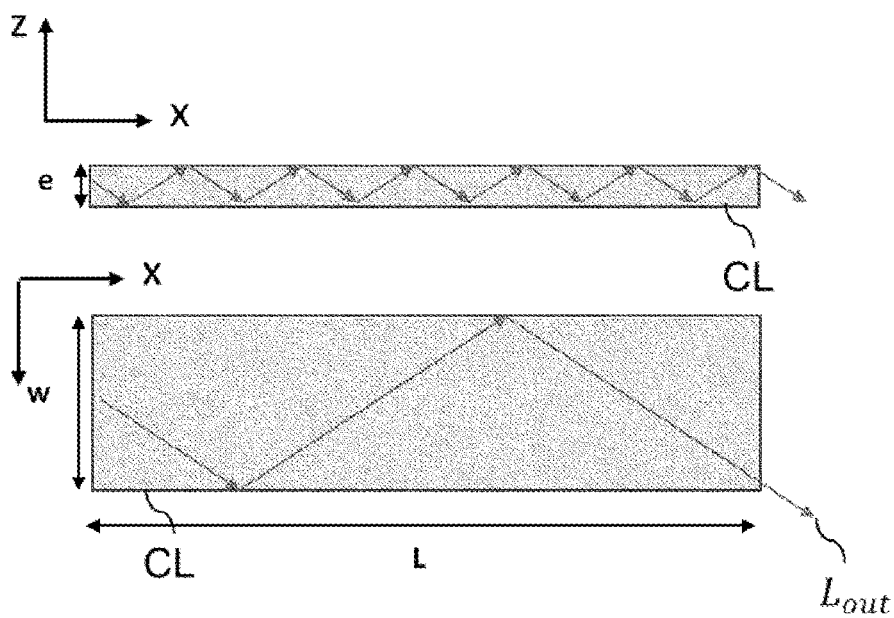
FIG. 1D and FIG. 1E, a schematic view of concentrators known in the prior art.
Figure 1E:
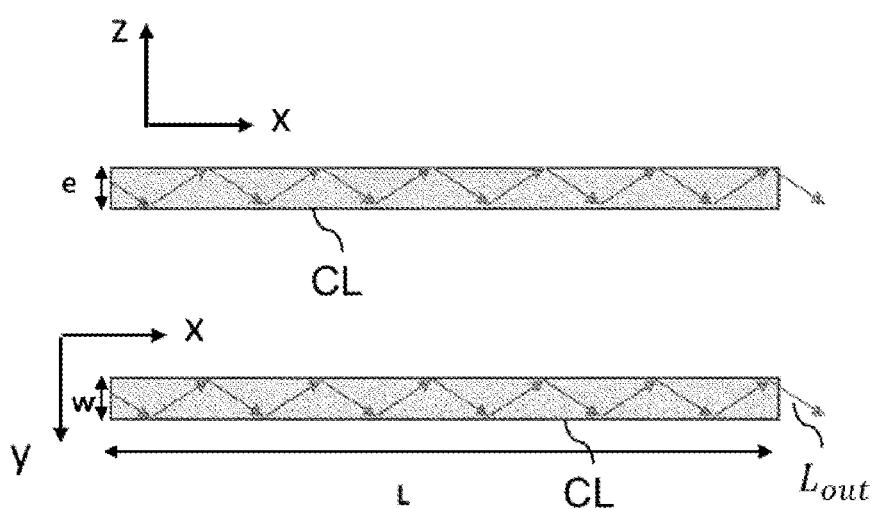

According to one embodiment, the concentrator is a fluorescent crystal. According to a first variant of this embodiment, in a manner similar to the devices in FIGS. 1A and 1B, the brightness triggering element comprises a plurality of light-emitting diodes LED which are configured to emit light-emitting radiation $L_d$ at a wavelength $\lambda_d$. According to this embodiment, the diodes are arranged such as to light at least one lighting face SI1, SI2 of the concentrator. In addition, the concentrator crystal is a fluorescent crystal, designed to absorb said light-emitting radiation $L_d$ emitted by the LED diodes, then to emit fluorescence radiation corresponding to the brightness radiation $L_F$ referred to above. Alternatively, according to another embodiment, the triggering element comprises lasers or flash lamps which are designed to pump the fluorescent crystal.

Preferably, in this embodiment, as in the concentrators according to the prior art, the vertical dimension e of the concentrator in a direction z perpendicular to the lighting face (known as the thickness) is greater than, or equal to, a length of absorption $L_{abs}$ of the light-emitting radiation $L_d$ by the concentrator. Thus, the radiation which is emitted by the LEDs is absorbed for by far the most part by the concentrator crystal. An excessively small thickness would lead to a substantial loss of the pump radiation, which would mostly pass through the crystal without being absorbed by it, and thus to a decrease in the global optical performance/ optical performance of the concentrator $P_{out}/P_{LED}$, where $P_{out}$ is the power of the output beam on the face FL1 and $P_{LED}$ is the pump power of the LEDs.

Alternatively, according to a second variant of this embodiment, the brightness triggering element comprises a lens, or any other optical element designed to focus or direct solar radiation onto a lighting face SI1, SI2 of the concentrator. According to this embodiment, the concentrator is designed to absorb the solar radiation, then emit fluorescence radiation, which is the brightness radiation referred to above. This embodiment makes it possible to reduce the number of photovoltaic cells for a given collection surface. In fact, the device according to the invention permits far better concentration than the conventional solar concentrators, i.e. the reduction of the surface covered by the photovoltaic cells can be a factor of 10 to 100.

Critically, the device according to the invention makes it possible to dispense with the limitation of the fluorescent concentrators according to the prior art as far as the thickness of the concentrator is concerned, in association with the absorption of the pump radiation. In fact, in a "1D" or "2D" fluorescent concentrator, there are two options:

either reduce the efficiency of the concentrator by maintaining a small thickness e, and thereby detracting from the absorption. In this case, the brightness can remain substantial.

or increase e in order to increase the absorption, and therefore decrease the brightness which is proportional to the ratio L/e.

On the contrary, in the device according to the invention, the first mirror M1 makes it possible to reduce the dimensions of the output face "artificially" (and therefore increase the brightness), without reducing the thickness e (and therefore without detracting from the absorption of the pump radiation). This characteristic is particularly advantageous for concentrators CL which emit beyond 1 μm, for which the absorption is sometimes low. In fact, in the case of doped glass concentrators for example, the concentration of the luminophores (and thus the absorption) will be limited by the interactions between the ions of the material (effect known as "quenching" of fluorescence, which has the effect of limiting the emission spectroscopic properties). The device according to the invention thus makes it possible to use low-absorption materials in concentrators which are efficient in the infrared spectrum (up to 10 μm).

Alternatively, according to another embodiment, the concentrator is a thermoluminescent crystal, and the brightness triggering element comprises a heating element which is configured to heat said concentrator crystal so that it emits the brightness radiation by thermoluminescence. This embodiment makes it possible to use concentrator crystals different from fluorescent crystals.

Figure 8:
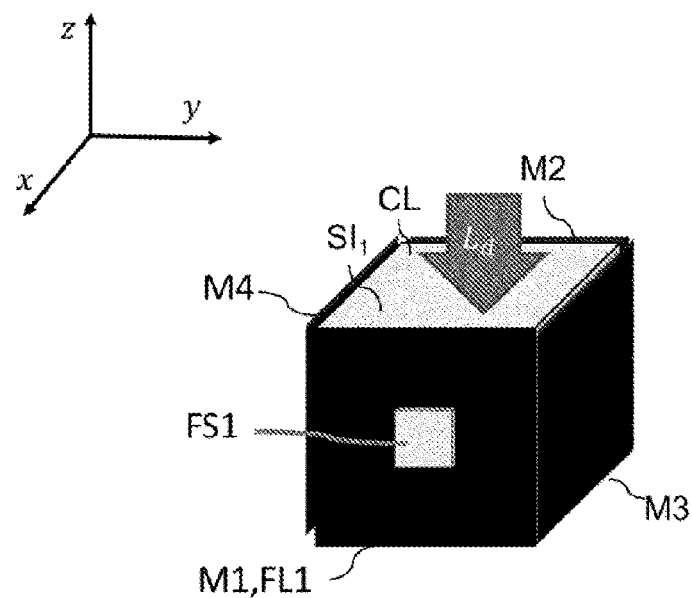
FIG. 8, an embodiment of the invention in which the concentrator crystal is a cube.

FIG. 8 shows an embodiment of the invention in which the concentrator crystal is a cube with a size a. In fact, in a "3D" concentrator, there is no preferential direction as far as the plane of the large pumping faces is concerned. It is therefore possible to select an appropriate geometry for the concentrator which makes it possible to reduce the size, for example a cube. In the embodiment in FIG. 8, the concentrator is a fluorescent crystal pumped by radiation $L_d$ by a lighting face $SI_1$. The dimension a of the concentrator cube is larger than the length of absorption $L_{abs}$ of the pump radiation $L_d$ by the concentrator. In this embodiment, in addition to the mirrors M1 and M2 on the lateral faces FL1 and FL2, the device comprises two additional mirrors M3, M4 covering the faces parallel to the plane (xz). These additional mirrors make it possible to increase the lighting on the output face FS1 by reflecting within the concentrator the brightness radiation which is not trapped by total internal reflection, and which should exit via the faces covered by the mirrors M3 and M4.

In the embodiment in FIG. 8, the first mirror M1 is designed such that the non-covered surface area defines a square output face with a dimension b smaller than a. Thus, by reducing the dimensions of the output face, it is possible to increase the brightness without reducing the dimension of the cube, and thus without detracting from the absorption of the pump radiation.

Figure 9:
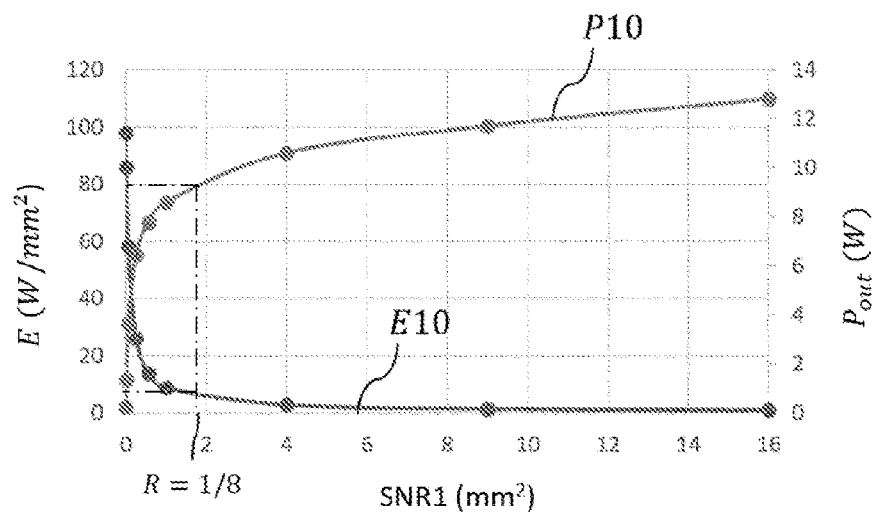
FIG. 9, the development of the output power $P_{out}$ of the output beam and of the lighting E according to the surface area of the output face.

FIG. 9 represents the result of a simulation by software of tracks of rays for a device identical to the one represented in FIG. 8, and for a cubic fluorescent concentrator of 4 mm per side lit by a pump radiation with power of $P_{LED}$=40 W. The simulation gives the development (curve P10) of the output power $P_{out}$ of the output beam and of the lighting E (curve E10) according to the surface area SFS1 of the output face FS1. As previously seen, it is possible to increase the lighting greatly while maintaining a substantial output power. The output power $P_{out}$ is associated directly with the transmission $T_{moy}$ (and therefore with the ratio R) and with the power of the output beam $P_{out,SM}$ which would exit from the first lateral face if the first mirror M1 did not exist on the basis of the equation $P_{out}=T_{moy}*P_{out,SM}$. When R decreases, the transmission $T_{moy}$ decreases, and therefore so does the output power. Thus, for a ratio R=1/8, the lighting is E≈10 W/mm² whereas the power of the output beam is approximately 9 W.

Figure 10A:
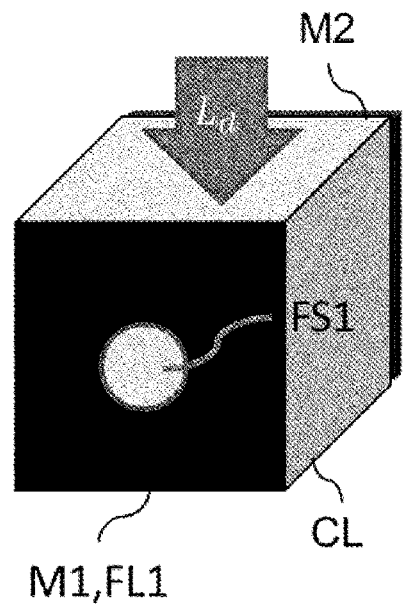
FIG. 10A and FIG. 10B, device according to embodiments of the invention in which the first mirror is designed such that the form of the non-covered surface area is respectively a disk and a letter "A"
Figure 10B:
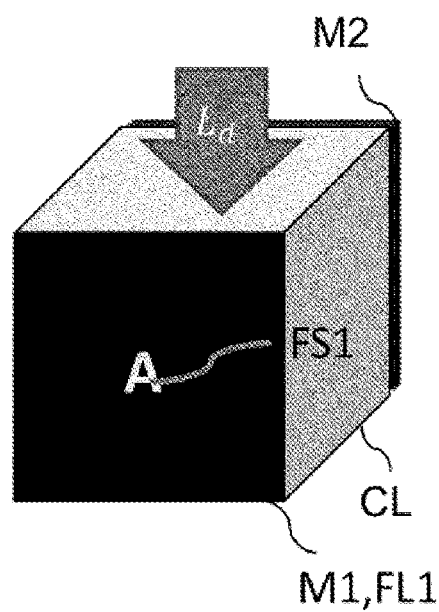

FIGS. 10A and 10B represent a device according to embodiments of the invention in which the first mirror M1 is designed such that the form of the non-covered surface area is respectively a disk and a letter "A". It is understood that the position of these output faces FS1 in the lateral face FL1 is free. The output faces can be in corners, in the center, attached to an edge, or not. These figures illustrate the modularity of the 3D concentrator device concerning the form of the output face. Unlike filters or shields which are commonly used in projection, the output lighting will increase if the surface area of the pattern to be projected decreases. This very specific property makes it possible to create high-performance displays with strong lighting.

Figure 11:
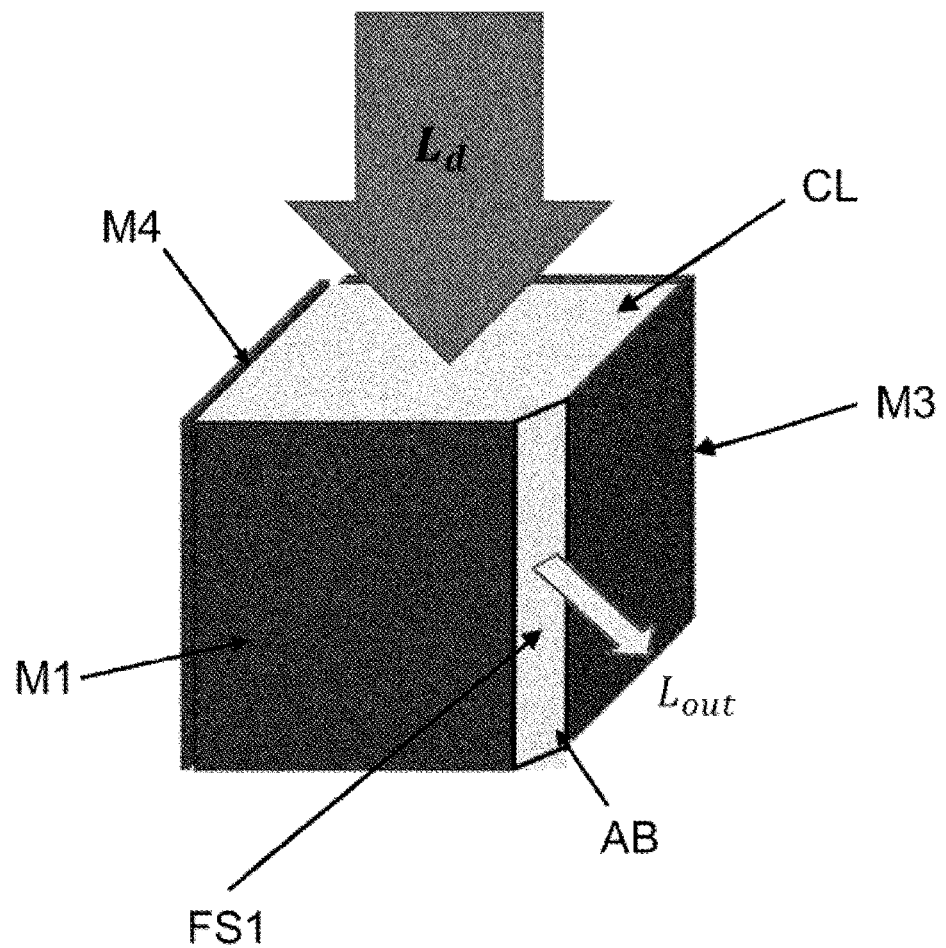
FIG. 11, an embodiment in which the concentrator crystal has a beveled edge.

FIG. 11 illustrates an embodiment in which the concentrator crystal has a beveled edge AB. The beveled edge is considered as forming part of the first lateral face. More specifically, the beveled edge AB is situated between the first lateral face and another face of the concentrator crystal. This face can be any face adjacent to the first lateral face. In the embodiment in FIG. 11, the beveled edge AB is not covered by a mirror reflecting the brightness radiation. Thus, the edge AB defines as a whole an output face FS1.

Alternatively, according to another embodiment, only a portion of a surface area of the beveled edge is not covered by a reflective mirror, with this portion defining an output face FS1. This embodiment makes it possible to reduce the surface area of the output face, and thus to increase the lighting.

In the calculation of the ratio R=SFS1/$S_L$, the surface area $S_L$ comprises the surface area of the beveled edge, and the non-covered surface area $SNR_1$ comprises the surface area of the portion of the beveled edge which is not covered by a mirror (or the edge AB as a whole if it is not covered by a mirror).

The embodiment in FIG. 11 makes it possible to increase the lighting of the output face by 10% to 30% in comparison with the embodiments of the invention with symmetrical concentrators (with only 6 faces which are parallel in pairs) previously referred to. In fact, by creating a beveled edge on the concentrator, interruption of symmetry is created in the parallelepiped structure. More specifically, the beveled edge artificially creates a cone or a supplementary escape area for certain brightness rays which are trapped by total internal reflection within the parallelepiped concentrator, which rays can exit from the concentrator by means of the edge. Without the beveled edge AB, these rays could not exit from the concentrator crystal.

Alternatively, according to another embodiment, the concentrator crystal has a beveled corner situated between a first lateral face and two other faces of the concentrator. Just like the embodiment in FIG. 11, the beveled corner is considered as forming part of the first lateral face, and the corner can be partly covered by a mirror, or not. This embodiment also makes it possible to increase the lighting of the output face in comparison with the embodiments of the invention with symmetrical concentrators previously referred to.

Figure 12:
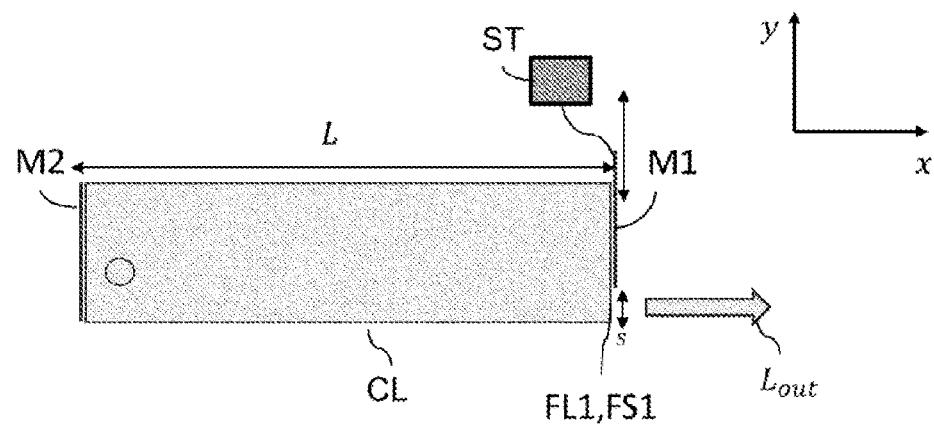
FIG. 12, an embodiment in which the first mirror is fitted on a translation system.

FIG. 12 illustrates an embodiment in which the first mirror M1 is fitted on a translation system ST, which is designed to be displaced relative to the first lateral face FL1, such as to reduce or increase the non-covered surface SFS1 of the output face FS1. In the example of FIG. 12, the first mirror is designed to define a rectangular output face with dimensions s×e, where e is the thickness of the concentrator. The translation system makes it possible to control the dimension s in order to increase or decrease the lighting E on the output face FS1. This embodiment makes it possible to control the lighting output from the emission module EM.

Figure 13A:
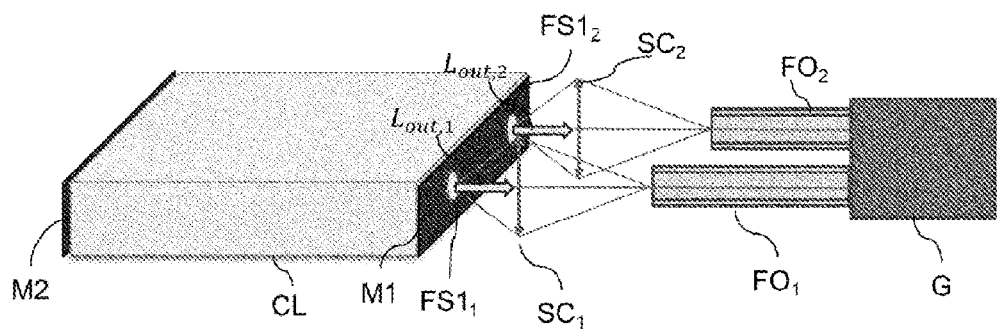
FIG. 13A, an embodiment in which a plurality of fiber-bearing outputs are combined in the form of a group of fibers.

The device according to the invention permits use of a plurality of output faces $FS1_i$ since the power of the output beam $L_{out}$ is low in comparison with the power circulating in the interior of the concentrator. FIG. 13A illustrates an embodiment in which a plurality of fiber-bearing outputs $FO1_i$ are combined in the form of a group G of fibers. In this case, the brightness at the output of the group G would be slightly lower than the brightness at the output of a single fiber, because of the difficulty in bringing all the fiber cores towards one another. On the other hand, the power of the radiation obtained from the group G will be strongly increased, as will the overall performance level. In the embodiment in FIG. 13A, the first mirror M1 is designed to define n≥1 non-covered surface areas, defining n output faces $FS1_i$ through which n output beams $L_{out,i}$ pass. The device also comprises n optical fibers $FO_i$ and n optical coupling systems $SC_i$ each designed to couple an output beam in a different optical fiber. The optical coupling systems can for example be one or a plurality of optical lenses. For calculation of the ratio R=SFS1/$S_L$, the surface area of the output face $S_s$ is equal to the sum of the surface area of all the output faces $FS1_i$. In the representation in FIG. 13A, by way of non-limiting example, n=2. Alternatively, according to another embodiment, a number different from n=2 is used.

The use of a fiber-bearing output makes it possible to simplify the conveying of the output beam to its application. The use of a fiber-bearing output in the device according to the invention is greatly simplified, taking into account the modularity of the output face, which makes it possible to adapt the dimensions of the output face to that of the optical fiber core. This makes it possible to ensure good coupling of the output beam $L_{out,i}$ associated with the output face $FS1_i$ in the associated optical fiber $FO_i$. For this purpose, it is necessary to adapt the geometric extent of each output beam $L_{out,i}$. It will be remembered that the geometric extent is the product of the surface area of the emitter area times the solid angle of the beam emitted.

Figure 13B:
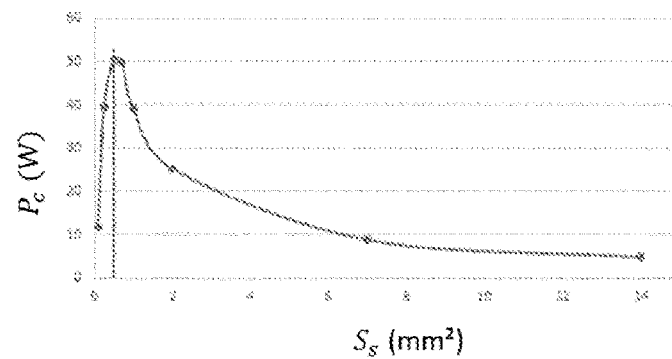
FIG. 13B, a development of the coupled power $P_c$ in an optical fiber, and according to the surface area of the output face.

FIG. 13B illustrates the development of the coupled power $P_c$ in an optical fiber according to the surface area of the output face (and therefore the geometric extent). By way of non-limiting example, the fiber has a numerical opening of 0.5, and a core diameter of 1.5 mm, giving a geometric extent $Et_{fibre}$=1.5 $10^{-2}$ cm$^2$·sr (for this simulation n=1). The concentrator is a Ce:YAG plate with dimensions L=100 mm; w=14 mm; e=1 mm and the power of the output beam times the output face is $P_{out}$=50 W. In addition, it is assumed that the emission of the concentrator is Lambertian. The coupled power $P_c$ in the fiber is associated with the power of the output beam $P_{out}$, with the geometric extent of the fiber ($Et_{fibre}$) and with that of the beam on the output face ($Et_c$) by the following equation: $P_c=(Et_{fibre}/Et_c) \cdot P_{out}$.

As shown in FIG. 13B, the coupled power goes via a maximum, for an output face surface area of $S_s$=380 µm, which corresponds in this specific case to the equality of the extents. For smaller surface area output faces, all of the power emitted by the concentrator can be coupled (since $Et_{conc}<Et_{fibre}$) and it is the transmission of the 3D concentrator which limits the performance levels ($P_{out}$ decreases). For the larger surface area output faces, it is the transmission of the coupling optical system which limits the performance levels because of the inadequacy of the geometric extents. Thus, preferably, the first mirror is designed such that the geometric extent of each output beam is equal to a geometric extent of the optical fiber coupling the output beam. This embodiment is designed for applications in which the directivity of the lighting must be controlled or adapted.

Figure 14:
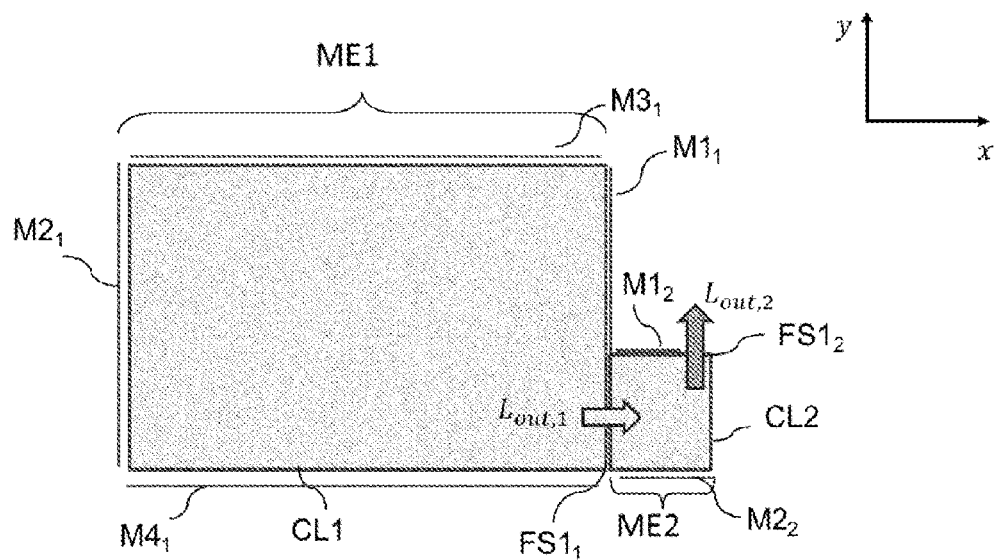
FIG. 14, an embodiment of the invention in which the device comprises a first and a second emission module.

FIG. 14 shows an embodiment of the invention in which the device comprises a first and a second emission module ME1, ME2. These modules are designed such that the concentrator CL1 (known as the first concentrator) of the first module pumps transversely the concentrator CL2 of the second emission module ME2 (known as the second concentrator). The device in FIG. 14 comprises a first brightness triggering element (not represented in FIG. 14) which is associated with the first emission module ME1. As previously seen, this element can be a plurality of LEDs, one or a plurality of optical elements designed to direct the solar radiation onto the first concentrator, or also an element designed to heat this concentrator.

A face of the second concentrator CL2, different from a lateral face $FL1_2$ where a second output face $FS1_2$ is situated, is attached to the output face $FS1_1$ of the first concentrator CL1. By this means, the first output beam $L_{out,1}$ obtained from the first emission module constitutes the brightness triggering element of the second emission module ME2. The second concentrator CL2 is designed to absorb the first output beam, then generate a second output beam $L_{out,2}$, known as secondary brightness radiation, with a central wavelength $\lambda_2$ which is offset relative to the central wavelength $\lambda_1$ of the first output beam. This device makes it possible to generate intense radiation, since the concentration effects are cumulative on the brightness.

Notably, the dimensions of the second concentrator depend only on the dimensions of the output face $FS1_1$ of the first concentrator CL1. Also preferably, the dimensions of the face of the second module on a plane parallel to the output face $FS1_1$ (plane yz) of the first concentrator are smaller than, or equal to, the dimensions of the output face $FS1_1$ of the first concentrator.

This point is very important, since the reduction of the size of the second concentrator CL2 involves the reduction of the mean length travelled in the interior of this concentrator. $L_{moy}$ can then become very much smaller than $L_p$, which has the effect of increasing the mean transmission (see FIGS. 8A and 8B). This makes it possible to use for CL2 materials which have higher losses than those of CL1.

In order to ensure good absorption of the first output beam in the second concentrator CL2, the width of the second concentrator is greater than a length of absorption $L_{abs,2}$ of the first beam by the second concentrator. In this case, "width of the second concentrator" means the dimension of the second concentrator in the direction of the length of the first concentrator, i.e. in the direction x.

By way of non-limiting example, the first concentrator (with dimensions $L_2$=100 mm; $w_2$=50 mm; $e_2$=1 mm) is made of Ce:LYSO, a first absorption band of which is situated in the UV spectrum, at approximately 360 nm, and the first triggering element comprises UV LEDs which emit in the first absorption band power of approximately 1 W/mm² continuously and 2.5 W/mm² in pulse mode. The first concentrator emits a first output beam $L_{out,1}$ at a central wavelength $\lambda_1$=430 nm. The second concentrator (with dimensions $L_2$=10 mm; $w_2$=0.5 mm; $e_2$=0.25 mm) is made of Ce:YAG, and has a second absorption band with overlapping with the spectrum of the first output beam, and emits a second output beam which is centered on $\lambda_2$=560 nm.

Taking into account the present technology of UV LEDs (with a level of filling of 16%), it is possible to put 800 LEDs on each large face of the first concentrator CL1. It is assumed that each LED operates in pulse mode, and emits power of 2.5 W. The pump power is therefore $P_{LED}$=4000 W. The power which is emitted by the first emission module ME1 is therefore 550 W (in pulse mode) on its first lateral face FL1₁ and with lighting of 11 W/mm². These values do not take into account the 3D concentrator effect caused by the mirrors $M1_1$ and $M2_1$. With a first output face $FS_1$ of the first concentrator with a rectangular form and dimensions of 0.25 mm×10 mm, the 3D concentration effect gives lighting on the first output face $FS1_1$ which is estimated at 28 W/mm².

Taking into account the size of the second concentrator and the surface area of $FS1_2$, and assuming there are losses of $\alpha_{1,2}$=3.10⁻⁴ mm⁻¹, the mean transmission for CL2 is 86%.

Simulations by means of ray tracking software make it possible to estimate the power emitted by the second concentrator when it is pumped by the first concentrator. The conversion performance level is calculated as 9.6%, taking into account the overlapping of the absorption and emission bands between the first and the second concentrator. The second, Ce:YAG concentrator thus emits power of 34 W on its first lateral face $FL1_2$. This measurement does not take into account the 3D concentrator effect caused by the mirrors M12 and M22. With a surface area of the second, rectangular output face $FS1_2$ having a small size of 25 μm×250 μm, the 3D concentration effect provides lighting on the second output face FS2 estimated at 4660 W/mm², i.e. 466 kW/cm². This value represents lighting more than 1800 times greater than that of the LEDs which pump the first concentrator. The power $P_{out,2}$ of the second output beam is $P_{out,2}$=29 W.

A very small surface area of the second output face FS2 was selected, since the dimensions of the second concentrator are very small relative to the length of loss $L_{p,2}$ of the second concentrator ($L_{p,2}$=3.3 m where $\alpha_2$=3.10⁻⁴ mm⁻¹). The 3D concentration effect can therefore be very high-performance in the second concentrator. Thus, the mean transmission remains at a value of 86%, whereas the surface area of the second output face $FS1_2$ is 10 times smaller than the surface area of the lateral face $FL1_2$ of the second concentrator.

The coefficient of concentration of this cascade of 3D concentrators is thus two orders of magnitude more than that provided by a single 1D or 2D concentrator. This considerable increase is obtained at the price of a low global optical/optical performance level $P_{out,2}/P_{LED}$, in this case of 0.7%.

However, in order to produce lighting of this type with lasers in this range of wavelengths, it would be necessary to produce a complex conversion chain with non-linear crystals (no laser crystal emits directly in the yellow-orange spectrum). The global optical/optical performance level would be a maximum of a few percent. The source proposed here is far simpler, with lighting which becomes competitive in comparison with lasers.

It should be noted that the example taken here with Ce:LYSO and Ce:YAG is far from being optimized, since the level of filling of the UV LEDs is only 16%, whereas that of the visible LEDs is 40% at present, with potential to achieve 70% in the future.

The cascade of concentrators could be highly advantageous for emission in the infrared spectrum, in the band 3-5 μm. Also, according to another embodiment, the first triggering element comprises visible or infrared LEDs (940 nm) the level of filling of which is greater than 40%. The second concentrator is made of sulfide or selenide glasses, the losses of which are relatively high at present. As seen above, the use of a small-sized concentrator makes it possible to avoid the problem of high losses.

Thus, the cascade of 3D concentrators according to the embodiment of FIG. 14 permits great flexibility for adapting to the existing materials and their properties. They represent a very important departure in the field of uncorrelated sources, of two to three orders of magnitude more than what exists at present.

The invention claimed is:
1. A light-emission device comprising:
   at least one emission module (ME) comprising:
   a luminescent crystal known as a concentrator crystal (CL) with at least six faces which are parallel in pairs, including a first and a second face, being lateral faces (FL1, FL2), perpendicular to a direction x and separated by a distance L corresponding to a horizontal dimension of said concentrator in the direction x;
   a first mirror (M1), which is configured such as to cover said first lateral face (FL1) at least partly, defining a surface area (SR1) covered by said first mirror, and at least one surface area (SFS1) which is not covered by said first mirror defining an associated output face (FS1, FS1$_1$, FS1$_2$);

a second mirror (M2), which is configured to cover at least 95% of said second lateral face (FL2);

a brightness triggering element (ED), which is designed to generate emission of brightness radiation (L$_F$) in said luminescent crystal;

a ratio R between the non-covered surface area (SFS1) and a surface area (S$_L$) of the first lateral face (FL1) being determined such that rays of the brightness radiation are reflected on said first and second mirrors, and are propagated over a mean distance L$_{moy}$ such that $$L_p = \frac{1}{\alpha} > L_{moy} \gg L$$

within the luminescent crystal before passing through at least one output face (FS1$_1$, FS1$_2$), forming an output beam (L$_{out}$), where α is a coefficient of loss per unit of length of said concentrator for said brightness radiation.

2. The device as claimed in claim 1, wherein said ratio R is 1/4 or less, preferably 1/8 or less.

3. The device as claimed in claim 1, wherein the brightness triggering element comprises a plurality of light-emitting diodes (LED) or lasers or flash lamps which are configured to emit light-emitting radiation (L$_d$) at a wavelength λ$_d$, said diodes being designed such as to illuminate at least one face known as the lighting face (SI1, SI2) of the concentrator, said concentrator being a fluorescent crystal designed to absorb said light-emitting radiation (L$_d$), then emit fluorescence radiation corresponding to said brightness radiation.

4. The device as claimed in claim 3, wherein a vertical dimension e of the concentrator in a direction z perpendicular to said lighting face is greater than, or equal to, a length of absorption L$_{abs}$ of said light-emitting radiation (L$_d$) by said concentrator.

5. The device as claimed in claim 1, wherein the brightness triggering element comprises a heating element which is configured to heat said concentrator crystal such that it emits said brightness radiation by thermoluminescence.

6. The device as claimed in claim 1, wherein the brightness triggering element comprises a lens, which is designed to focus solar radiation on a so-called lighting face (SI1, SI2) of the concentrator, said concentrator being designed to absorb said solar radiation, then emit fluorescence radiation corresponding to said brightness radiation.

7. The device as claimed in claim 1, wherein the concentrator crystal has a beveled edge situated between the first lateral face and another face of said concentrator crystal, a surface area of the beveled edge being considered as forming part of the surface area of the first lateral face for calculation of said ratio R, at least one portion of a surface area of the beveled edge not being covered and defining an associated output face.

8. The device as claimed in claim 1, wherein the concentrator crystal has a beveled corner situated between the first lateral face and two other faces of said concentrator crystal, a surface area of the beveled corner being considered as forming part of the surface area of the first lateral face for calculation of said ratio R, at least one portion of said surface area of the beveled corner not being covered, and defining an associated output face.

9. The device as claimed in claim 1, wherein said first mirror is designed to define n≥1 non-covered surface areas, defining n output faces (FS1$_i$) through which n output beams (L$_{out,1}$, L$_{out,2}$) pass, said device also comprising:

n optical fibers (FO$_i$); and n optical coupling systems (SC$_i$), each designed to couple an output beam in a different optical fiber.

10. The device as claimed in claim 9, wherein the first mirror (M1) is designed such that a geometric extent of each output beam is substantially equal to a geometric extent of said optical fiber coupling said output beam.

11. The device as claimed in claim 1, comprising two additional mirrors (M3, M4) covering two parallel faces known as sections of the concentrator, said two additional mirrors being designed such as to cover all of the sections.

12. The device as claimed in claim 1, comprising a first and a second emission module (ME1, ME2) and a first brightness triggering element which is associated with the first emission module, a face of the concentrator crystal (CL2) of the second emission module, different from a lateral face, being attached to an output face (FS1$_1$) of the concentrator crystal (CL1) of said first emission module, such that the first output beam (L$_{out,1}$) of the first emission module, known as the primary brightness radiation, constitutes the brightness triggering element of the second emission module, with the second emission module generating a second output beam (L$_{out,2}$), known as the secondary brightness radiation, having a central wavelength which is offset relative to a central wavelength of said primary brightness radiation.

13. The device as claimed in claim 12, wherein dimensions of said second module on a vertical plane yz parallel to said output face of the concentrator crystal of said first module are smaller than, or equal to, dimensions of said output face of the concentrator of said first emission module.

14. The device as claimed in claim 12, wherein a dimension of said concentrator of the second module in said direction x is greater than a length of absorption L$_{abs,2}$ of said primary brightness radiation by said concentrator of said second module.

15. The device as claimed in claim 1, wherein said first mirror is fitted on a translation system (ST) which is designed to displace said first mirror relative to said first lateral face, such as to reduce or increase the non-covered surface area.

16. The device as claimed in claim 1, wherein said first mirror is designed such that the form of a non-covered surface area is square, rectangular, circular, elliptical, triangular, or also polygonal.

* * * * *